(12) United States Patent
Na

(10) Patent No.: US 10,690,567 B2
(45) Date of Patent: *Jun. 23, 2020

(54) OPTICAL TIME DOMAIN REFLECTOMETER USING POLYMER WAVELENGTH TUNABLE LASER

(71) Applicant: SOLiD, INC., Seongnam-si, Gyeonggi-do (KR)

(72) Inventor: Kee-Woon Na, Yongin-si (KR)

(73) Assignee: SOLiD, INC., Seongnam-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/166,381

(22) Filed: Oct. 22, 2018

(65) Prior Publication Data

US 2019/0056290 A1 Feb. 21, 2019

Related U.S. Application Data

(63) Continuation of application No. 15/101,146, filed as application No. PCT/KR2014/011602 on Dec. 1, 2014, now Pat. No. 10,139,310.

(30) Foreign Application Priority Data

Dec. 2, 2013 (KR) .......................... 10-2013-0148552

(51) Int. Cl.
*G01M 11/00* (2006.01)
*H04B 10/07* (2013.01)
(Continued)

(52) U.S. Cl.
CPC ......... *G01M 11/3127* (2013.01); *H01S 5/146* (2013.01); *H04B 10/07* (2013.01);
(Continued)

(58) Field of Classification Search
CPC ... G01M 11/3127; H01S 5/0064; H01S 5/0687; H01S 5/146; H04B 10/07; H04B 10/071; H04B 10/503
(Continued)

(56) References Cited

U.S. PATENT DOCUMENTS 5,543,912 A 8/1996 Kada et al.
6,118,562 A 9/2000 Lee et al.
(Continued)

FOREIGN PATENT DOCUMENTS

CN 102269911 A * 12/2011
CN 102269911 A 12/2011
(Continued)

OTHER PUBLICATIONS

Minneman et al; Very high sensor density multiplexing using a wavelength to time domain reflectometry approach based on a rapidly swept Akinetic laser—2015, 24th International conference on optical fiber sensors. (Year: 2015).*
(Continued)

*Primary Examiner* — Amritbir K Sandhu
(74) *Attorney, Agent, or Firm* — Sughrue Mion, PLLC

(57) ABSTRACT

The present invention relates to an optical time domain reflectometer using, as a optical source, a polymer wavelength tunable laser which tunes the wavelength of an optical signal by using polymer grating. The optical time domain reflectometer of the present invention tunes the wavelength of a polymer wavelength tunable laser that outputs a constant optical signal and inspects cutting, reflection, and damage of an optical line by separating an optical signal returning from the optical line by an optical filter having a specific central wavelength. Since a optical source
(Continued)

having a constant light intensity is used, the present invention has an effect of reducing the nonlinear effect generated in an optical line.

13 Claims, 7 Drawing Sheets

(51) Int. Cl.
*H01S 5/14* (2006.01)
*H04B 10/071* (2013.01)
*H04B 10/50* (2013.01)
*H01S 5/00* (2006.01)
*H01S 5/0687* (2006.01)

(52) U.S. Cl.
CPC ......... *H04B 10/071* (2013.01); *H04B 10/503* (2013.01); *H01S 5/0064* (2013.01); *H01S 5/0687* (2013.01)

(58) Field of Classification Search
USPC .......................................................... 398/21
See application file for complete search history.

(56) References Cited

U.S. PATENT DOCUMENTS

| | | | |
|---|---|---|---|
| 6,282,361 B1* | 8/2001 | Nishimura | G02B 6/12021 385/10 |
| 6,850,360 B1 | 2/2005 | Chen et al. | |
| 7,060,967 B2 | 6/2006 | Thingbo et al. | |
| 7,333,680 B2 | 2/2008 | Yong et al. | |
| 8,971,704 B2 | 3/2015 | Cavaliere et al. | |
| 9,106,361 B2* | 8/2015 | Na | H04B 10/506 |
| 10,139,310 B2* | 11/2018 | Na | H04B 10/07 |
| 2003/0231888 A1 | 12/2003 | Takashina et al. | |
| 2009/0016726 A1 | 1/2009 | Suzuki et al. | |
| 2009/0168817 A1* | 7/2009 | Ishikawa | H01S 5/0687 372/20 |
| 2010/0014071 A1 | 1/2010 | Hartog | |
| 2010/0208756 A1 | 8/2010 | Noh | |
| 2011/0116799 A1 | 5/2011 | Effenberger | |
| 2011/0141457 A1* | 6/2011 | Levin | G01M 11/3127 356/73.1 |
| 2018/0017464 A1 | 1/2018 | Na | |

FOREIGN PATENT DOCUMENTS

| | | | |
|---|---|---|---|
| KR | 10-1997-0028648 A | | 6/1997 |
| KR | 10-1998-0083657 A | | 12/1998 |
| KR | 10-2000-0002619 A | | 1/2000 |
| KR | 10-2004-0023305 A | | 3/2004 |
| KR | 10-2005-0104945 A | | 11/2005 |
| KR | 20050104945 A | * | 11/2005 |
| KR | 10-2009-0011837 A | | 2/2009 |

OTHER PUBLICATIONS

Office Action issued in parent U.S. Appl. No. 15/101,146 dated Feb. 22, 2018.

Notice of Allowance issued in parent U.S. Appl. No. 15/101,146 dated Jul. 16, 2018.

* cited by examiner

OPTICAL TIME DOMAIN REFLECTOMETER USING POLYMER WAVELENGTH TUNABLE LASER

CROSS-REFERENCE TO RELATED APPLICATIONS

This application is a Continuation of U.S. application Ser. No. 15/101,146 filed Jul. 28, 2016, which is a National Stage of PCT International Application No. PCT/KR2014/011602, filed Dec. 1, 2014, and claims priority from Korean Patent Application No. 10-2013-0148552 filed Dec. 2, 2013, the contents of which are incorporated herein by reference in their entireties.

TECHNICAL FIELD

The present invention relates, in general, to technology for checking optical fiber cables and, more particularly, to an Optical Time Domain Reflectometer (OTDR) for checking the state of optical fiber cables by generating a fixed amplitude of optical pulses while varying the wavelength of an optical source using a polymer Bragg grating waveguide.

BACKGROUND ART

Recently, with the rapid increase in multimedia services over LTE mobile communication networks, optical communication networks are increasingly used as backbone networks for the mobile communication networks. Also, Fiber-To-The Home (FTTH) rapidly increases with the increase in multimedia services at home, such as a Video-On-Demand (VOD) service. Meanwhile, as multimedia services based on such optical fiber cables increase, service providers need to continuously check the states of a great number of optical fiber cables dispersed over wide areas, and in the event of a failure, they must restore optical fiber cables by immediately finding the location where a fault occurs.

As a typical optical measuring instrument for checking optical fiber cables and for finding the location where a fault occurs, there is an Optical Time Domain Reflectometer (Hereinafter, called OTDR) using optical pulses. In an OTDR, a laser 100 inputs an optical pulse, having a large amplitude and a short pulse width, to an optical fiber cable and receives an optical pulse reflected from the cleaved fiber ends or an optical fiber connector, as illustrated in FIG. 1, whereby the result shown in FIG. 2 may be obtained. Then, the state of the optical fiber cable may be estimated by analyzing the received optical pulse. Because the principle of how an OTDR operates corresponds to known technology, a detailed description thereabout will be omitted.

(Reference: Korean Patent Application Publication No. 2004-23305 and Korean Patent No. 199128648)

A conventional OTDR using optical pulses is useful in the management of the quality of optical fiber cables but has the following disadvantages.

First, it is difficult to increase the dynamic range thereof. Here, the dynamic range means the distance measurable using the OTDR, and it is necessary to increase the amplitude of an optical pulse in order to increase the dynamic range. However, if the amplitude of the optical pulse is increased so as to be equal to or greater than the threshold thereof, a strong nonlinear effect arises from the interaction between an optical fiber cable and an optical pulse, and the shape of the optical pulse is distorted, thus causing measurement error. In order to avoid such error, currently, the length (width) of an optical pulse is increased, rather than increasing the amplitude of the optical pulse. In this case, the dynamic range may be increased. However, with the increase in the length of an optical pulse, the resolution of the OTDR decreases, as shown in FIG. 3. The shorter the length of an optical pulse, the higher the resolution. Resolution is represented using parameters such as an event dead zone, an attenuation dead zone, and the like. Because these features are associated with each other, if one feature is enhanced, the other feature may be degraded.

Also, as another method for increasing the dynamic range, an optical amplifier (for example, an Erbium-doped fiber amplifier (EDFA)) may be used, but because the conventional OTDR uses a high-power optical pulse, the optical intensity of which quickly changes over time, it is inappropriate to use the EDFA to amplify the optical pulse. As described above, the conventional art has limitations in improving the dynamic range and resolution, and thus technology for solving these problems is required.

DISCLOSURE

Technical Problem

Accordingly, the present invention has been made keeping in mind the above problems occurring in the conventional art, and an object of the present invention is to provide an OTDR in which the dynamic range and resolution thereof are improved.

Also, the present invention intends to provide an OTDR in which a nonlinear effect, caused by an optical signal for measurement in an optical fiber cable, may be minimized, and in which an optical amplifier such as an EDFA may be used.

Technical Solution

According to one aspect of the present invention, an Optical Time Domain Reflectometer (OTDR) for checking a state of an optical fiber cable may include a wavelength-tunable laser (402) for outputting an optical signal having a variable wavelength; and a signal processing and control unit (410) for outputting a control signal for tuning an operating wavelength of the wavelength-tunable laser (402).

According to one aspect of the present invention, the wavelength-tunable laser (402) may include a laser diode (501), one face of which is anti-reflection coated; and a polymer Bragg grating waveguide (504) in which a reflected wavelength is controlled by a thermal electrode (502), wherein the thermal electrode (502) may control a temperature of the polymer Bragg grating waveguide (504) based on the control signal.

According to one aspect of the present invention, an optical circulator (404) for causing the optical power from the wavelength-tunable laser (402) to be incident on the optical fiber cable (102) and sending a signal reflected from the optical fiber cable (102) to an optical filter (406) may be further included.

According to one aspect of the present invention, the wavelength-tunable laser (402) may maintain constant intensity of optical power.

According to one aspect of the present invention, the control signal may have two or more levels, and the wavelength-tunable laser (402) may output an optical signal having a different wavelength depending on each of the levels.

According to one aspect of the present invention, a post-optical amplifier (403) for amplifying an optical power from the wavelength-tunable laser (402) may be further included.

According to one aspect of the present invention, a pre-optical amplifier (405) for amplifying an optical power from the optical circulator (404) and sending the amplified optical power to the optical filter (406) may be further included.

According to one aspect of the present invention, an Optical Time Domain Reflectometer (OTDR) for checking a state of an optical fiber cable may include a wavelength-tunable laser (402) for outputting an optical signal having a variable wavelength; and a signal processing and control unit (410) for outputting a control signal for tuning an operating wavelength of the wavelength-tunable laser (402), wherein the wavelength-tunable laser (402) may include a laser diode (501), one face of which is anti-reflection coated; and a polymer Bragg grating waveguide (504), in which a reflected wavelength is controlled by a thermal electrode (502), for operating as an external resonator of the laser diode (501), wherein the thermal electrode (502) may control a temperature of the polymer Bragg grating waveguide (504) based on the control signal.

According to one aspect of the present invention, an optical circulator (404) for causing the optical power from the wavelength-tunable laser (402) to be incident on the optical fiber cable (102) and outputting a signal reflected from the optical fiber cable (102) and an optical filter (406) for filtering the output of the optical circulator (404) and outputting it may be further included.

According to one aspect of the present invention, a directional optical coupler for causing the optical power from the wavelength-tunable laser (402) to be incident on the optical fiber cable (102) and outputting a signal reflected from the optical fiber cable (102) and an optical filter (406) for filtering the output of the directional optical coupler and outputting it may be further included.

According to one aspect of the present invention, a wavelength-tunable laser (402) generates an optical signal to be incident on an optical fiber cable in order to check a state of the optical fiber cable, a wavelength of the optical signal changing over time, but an optical intensity of the optical signal being controlled so as to have a predetermined magnitude regardless of the wavelength; and an optical filter (506) for extracting an optical signal having a specific optical wavelength from among optical signals received from the optical fiber cable and an optical receiver unit (407) for photoelectric conversion of the optical signal extracted by the optical filter (506) may be included.

According to one aspect of the present invention, the wavelength-tunable laser may include a polymer Bragg grating waveguide (504), and the wavelength of the optical signal of the wavelength-tunable laser may be controlled depending on a temperature of the polymer Bragg grating waveguide (504).

Advantageous Effects

In the OTDR according to one aspect of the present invention, because the intensity of an optical signal for measurement does not change over time, there is no non-linear effect between the optical signal and an optical fiber cable, which may arise from the variable intensity of the optical signal over time, whereby measurement error may be reduced.

Also, in the OTDR according to one aspect of the present invention, because the intensity of an optical signal for measurement does not change over time, an EDFA, the characteristics of which frequently change with variation in optical intensity, may be used, thus having the effect of increasing the dynamic range of the OTDR.

BEST MODE

The above-mentioned objects, features and advantages are clearly understood from the following detailed description when taken in conjunction with the accompanying drawings so that the inventive concept may be easily implemented by those skilled in the art. Also, descriptions of known functions and configurations which have been deemed to make the gist of the present invention unnecessarily obscure will be omitted below. Hereinafter, a preferred embodiment of the present invention will be described in detail with reference to the accompanying drawings.

First, the principle of how the passive optical device used in the present invention operates is described briefly. A Bragg grating waveguide is a passive optical device that reflects only optical signals of the wavelength (1), which is set based on the grating interval, among incident optical signals of different wavelengths, but transmits signals of the other wavelengths.

A polymer Bragg grating waveguide is a Bragg grating waveguide made of a polymer, and is a passive optical device that changes the optical wavelength reflected from a Bragg grating using the thermo-optic effects of the polymer. A polymer Bragg grating is used as an optical filter mainly on an optical receiver side or the like. Also, it is a device that is widely used in an optical communication field, and corresponds to known technology.

(Reference: Korean Patent No. 10-0367095)

Figure 1:
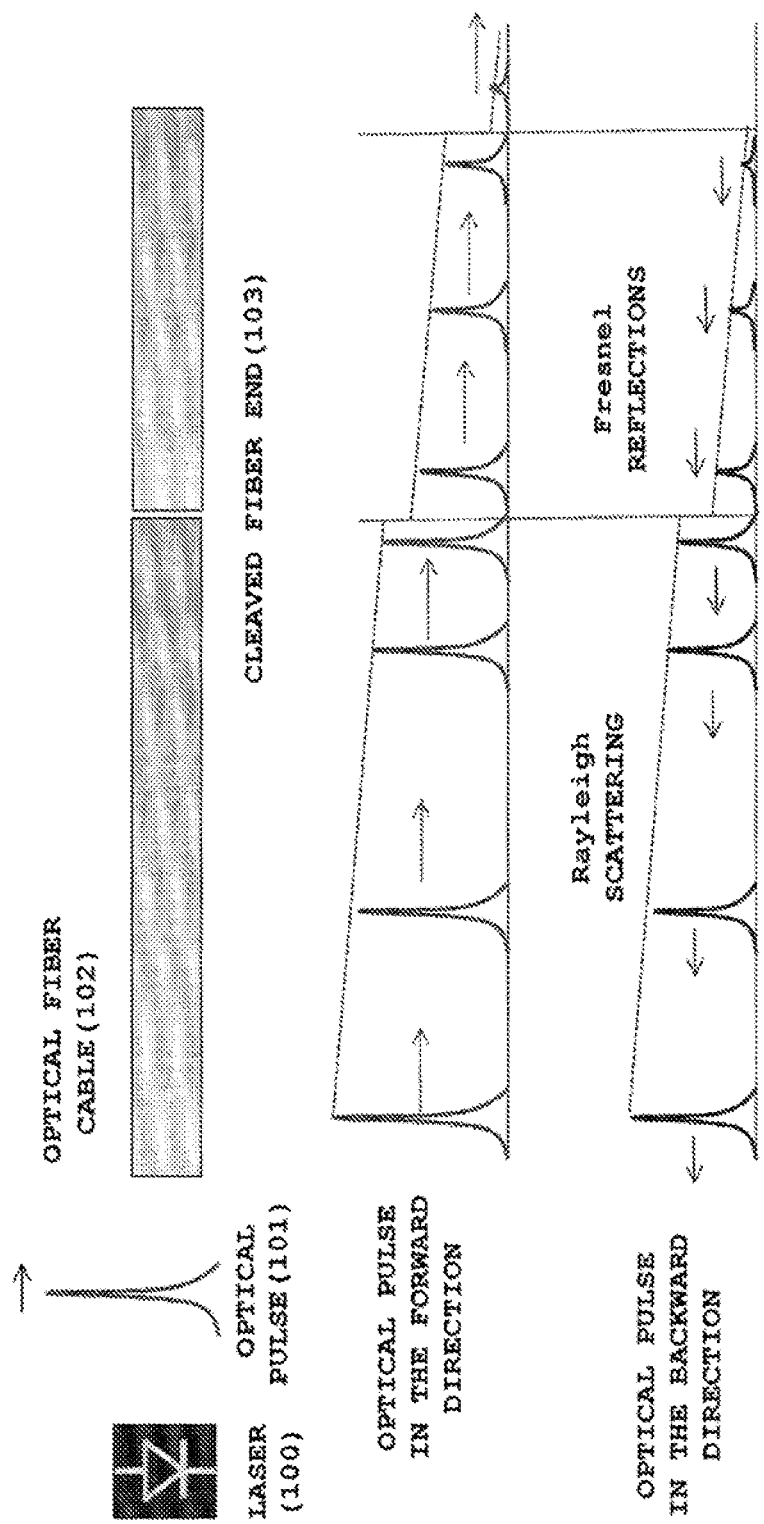
FIG. 1 is a configuration diagram for describing the principle of how a common OTDR operates.
Figure 2:
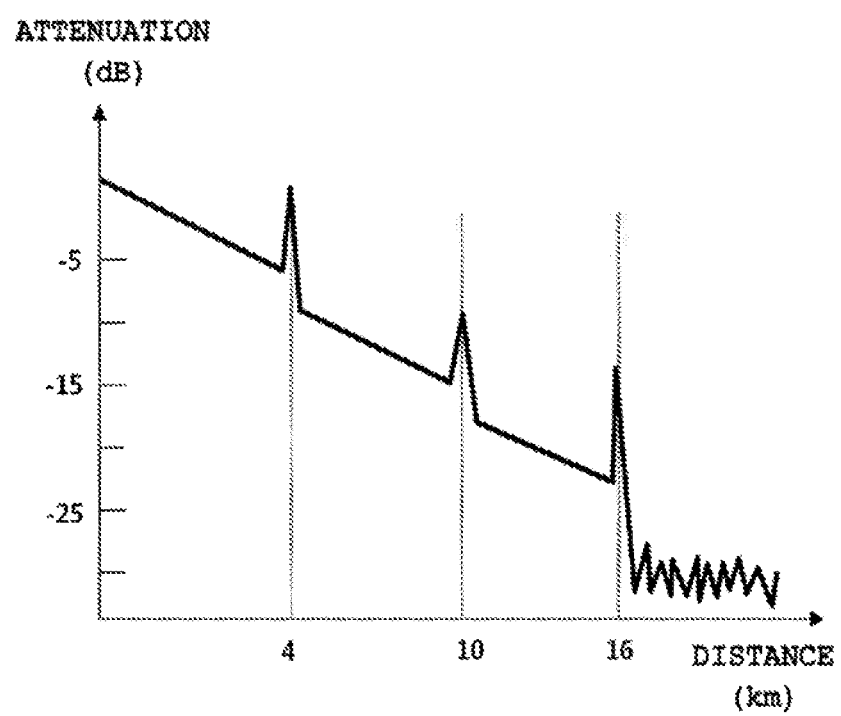
FIG. 2 is a view that shows an example of the measurement result of a common OTDR.
Figure 3:
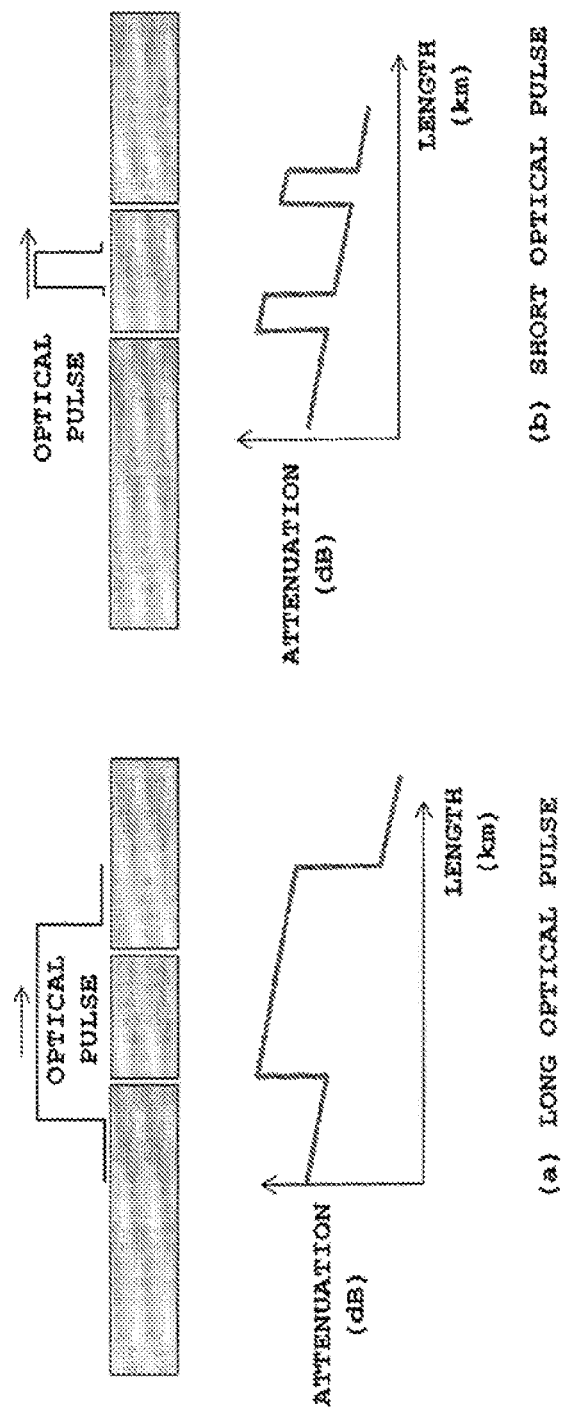
FIG. 3 is a view describing an optical pulse width and resolution in a conventional OTDR.
Figure 4:
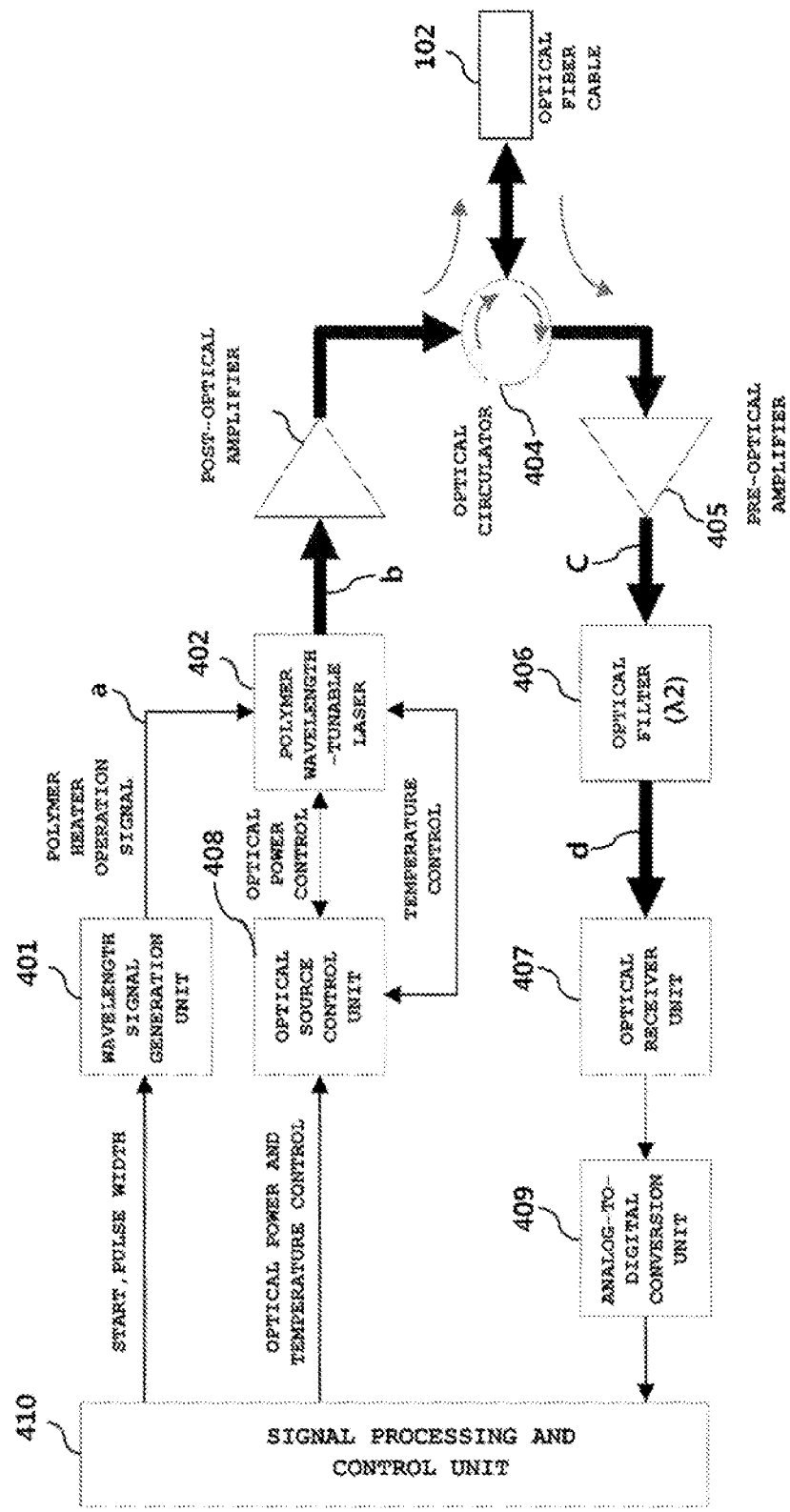
FIG. 4 is a configuration diagram of an OTDR according to an embodiment of the present invention.

FIG. 4 is a view that shows the configuration of an OTDR according to an embodiment of the present invention.

As illustrated in FIG. 4, the OTDR according to the present invention includes a polymer wavelength-tunable laser 402, an optical circulator 404, an optical filter 406, an optical receiver unit 407, an analog-to-digital conversion unit 409, a signal processing and control unit 410, a wavelength signal generation unit 401, an optical source control unit 408, a post-optical amplifier 403, and a pre-optical amplifier 405.

Figure 5:
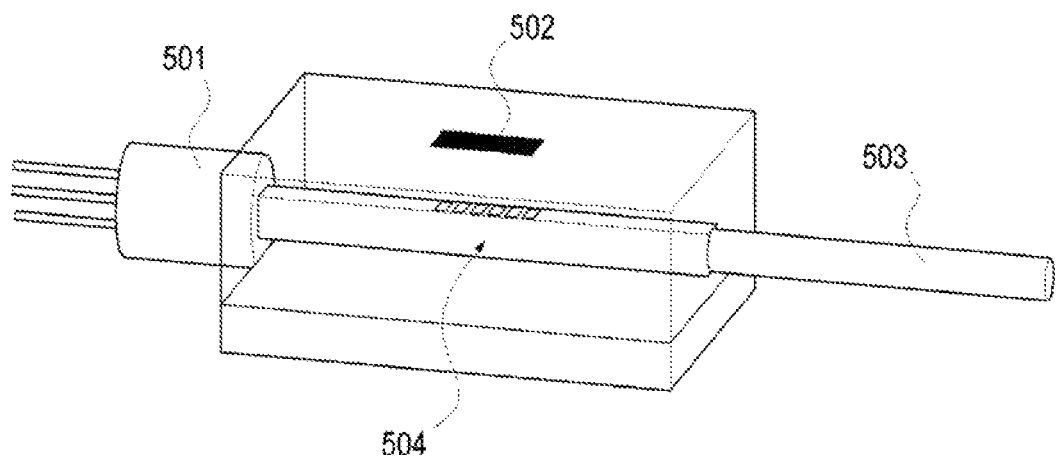
FIG. 5 is a view that shows the structure of a polymer wavelength-tunable laser according to an embodiment of the present invention.

First, the configuration of the polymer wavelength-tunable laser 402 will be described in detail with reference to FIG. 5.

The polymer wavelength-tunable laser 402 outputs an optical signal having a variable wavelength. The polymer wavelength-tunable laser 402 is configured to include a laser diode 501, which outputs a continuous wave (CW) optical signal and one face of which is anti-reflection coated, a polymer Bragg grating waveguide 504 for controlling the wavelength of a CW laser through the external resonance with the laser diode 501, and a thermal electrode 502 for changing and controlling the temperature of the Bragg grating by applying heat to the polymer Bragg grating waveguide 504.

The polymer Bragg grating waveguide 502 is configured such that a waveguide is made of polymer material and a Bragg grating is formed in the waveguide. As described above, the Bragg grating waveguide is a passive optical device that reflects only optical signals of a specific optical wavelength λ1, among incident optical signals of different wavelengths, but transmits signals of the other wavelengths.

Therefore, in the optical power output from the laser diode 501, one face of which is anti-reflection coated, the optical signal of the optical wavelength λ1 is reflected from the polymer Bragg grating waveguide 504 and returns to the laser diode 501. Therefore, the laser diode 501 and the polymer Bragg grating waveguide 504 operate as an external resonator, whereby the laser diode 501 outputs an optical signal of the optical wavelength λ1.

Meanwhile, a polymer has thermo-optic effects and a characteristic whereby the refractive index thereof changes with heat. Therefore, the polymer Bragg grating waveguide 504 may tune the reflected optical wavelength to another optical wavelength λ2 depending on the heat applied thereto by the thermal electrode 502, whereby the resonant wavelength between the laser diode 501 and the polymer Bragg grating waveguide 504 is tuned. Consequently, the laser diode 501 outputs an optical signal of the optical wavelength λ2.

Figure 6:
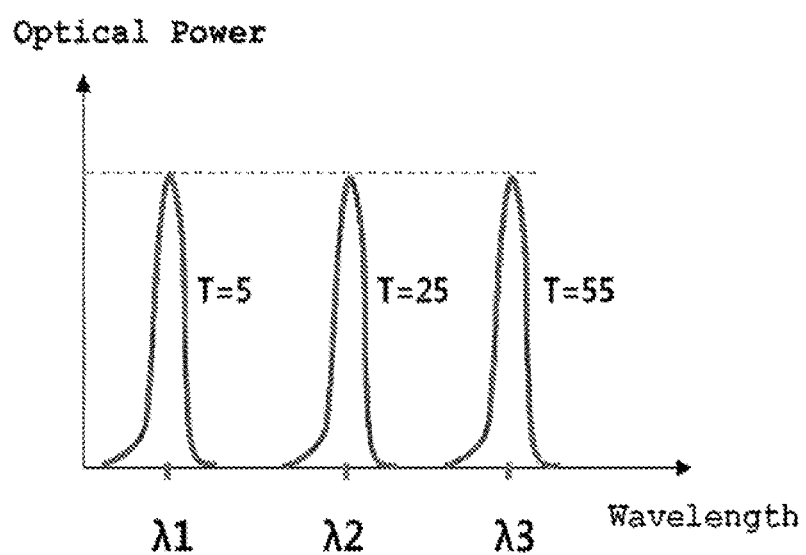
FIG. 6 is a view that shows an example of a change in a wavelength, output from a polymer wavelength-tunable laser, depending on the temperature controlled by a thermal electrode in a Polymer Bragg Grating waveguide.

FIG. 6 illustrates the optical power output from a polymer wavelength-tunable laser depending on a change in the temperature of the polymer Bragg grating waveguide, which is controlled by the thermal electrode 502. In FIG. 6, when the temperature T is 5, 25, and 55° C., the wavelength of the optical power of the polymer wavelength-tunable laser 402 is λ1, λ2, and λ3, respectively (λ1<λ2<λ3). Here, because the optical source control unit maintains the optical power of the polymer wavelength-tunable laser 402 constant, the intensity thereof is the same in each case. Also, the optical source control unit 408 maintains the temperature of the laser diode 501 constant in the polymer wavelength-tunable laser 402.

Back to FIG. 4, the operation of the OTDR using the polymer wavelength-tunable laser 402 is described. First, the signal processing and control unit 410 outputs a control signal for tuning the operating wavelength of the polymer wavelength-tunable laser 402. The signal processing and control unit 401 sends the optical source control unit 408 a control signal for controlling the temperature and the intensity of the optical power of the laser diode 501 in the polymer wavelength-tunable laser 402, and the optical source control unit 408 performs control in response to the control signal and thereby controls the temperature and the intensity of the optical power of the laser diode 501. Here, the configuration of the optical source control unit 408 may be the same as a configuration for Automatic Power Control (APC) and Automatic Temperature Control (ATC) of a common laser.

The signal processing and control unit 410 sends a control signal concerning the start of a pulse and a pulse width in order to make the wavelength signal generation unit 401 generate a polymer heater operation signal (a in FIG. 4). Next, the thermal electrode 502 of the polymer wavelength-tunable laser 402 controls the temperature of the polymer Bragg grating waveguide 504 in response to the control signal.

Figure 8:
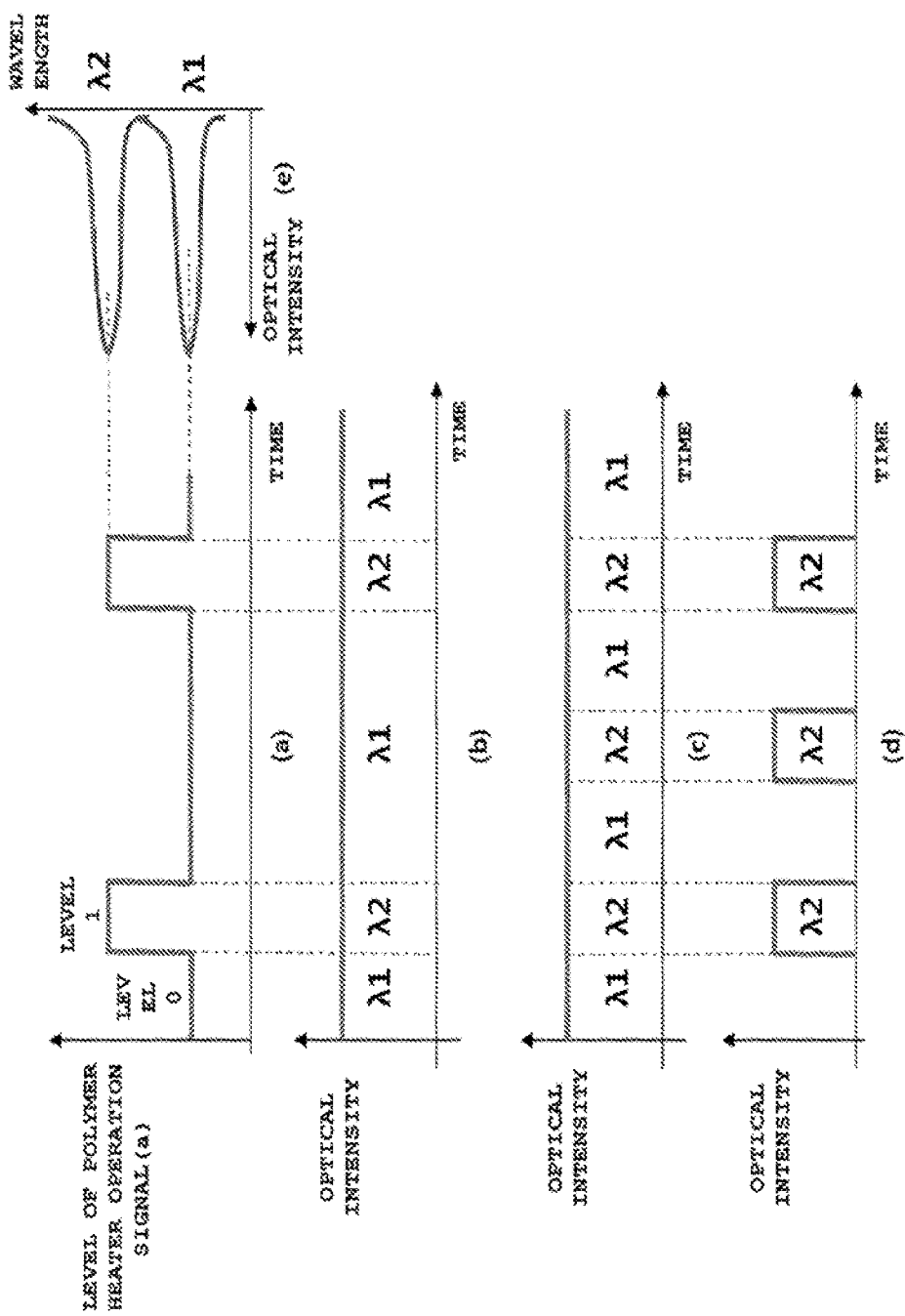
FIG. 8 shows the characteristics of a signal output from a wavelength-tunable laser, a signal reflected from an optical fiber cable, and a signal output from an optical filter.

Here, as illustrated in (a) of FIG. 8, if the optical wavelength reflected from the polymer Bragg grating waveguide is set to λ1 when the heater operation signal is at a LOW level (level 0), and if the optical wavelength reflected from the polymer Bragg grating waveguide is set to λ2 when the heater operation signal is at a HIGH level (level 1), the polymer wavelength-tunable laser 402 generates optical signals having the optical wavelengths of λ1 and λ2 for the respective cases, as shown in (e) of FIG. 8.

Also, the optical power of the polymer wavelength-tunable laser 402, compared with the polymer heater operation signal, is as shown in FIG. 8 (b). Referring to the drawing, the optical power is maintained at a constant level along the time axis, and the wavelength of the polymer wavelength-tunable laser 402 changes to λ1 or λ2 depending on the level of the heater operation signal.

The optical signal for measurement, output from the wavelength-tunable laser 402 in order to check the state of the optical fiber cable 102, takes a form in which multiple wavelengths, including a specific wavelength, are alternately exhibited over time, and a part having a specific wavelength has the form of an optical pulse.

For example, as illustrated in (b) of FIG. 8, the optical signal for measurement is seen such that optical signals having the wavelengths λ1 and λ2 are alternately exhibited over time, and when the part having the wavelength λ2 is separated from the optical signal, it has the form of an optical pulse or a form similar thereto.

The optical power of the polymer wavelength-tunable laser 402 is incident on the optical fiber cable 102 via the post-optical amplifier 403 and the optical circulator 404. The incident optical signal is reflected depending on the state of the optical fiber cable, and the reflected optical signal is incident on the optical circulator 404 and is output to the optical filter 406 via the pre-optical amplifier 405.

The optical signal reflected from the optical fiber cable 102 is illustrated in FIG. 8 (c). The optical signal form shown in FIG. 8 (c) is an example, and the optical signal may have a different form depending on the state of the optical fiber cable. The optical filter 406 passes an optical signal of wavelength λ2, but does not pass an optical signal of the other wavelength, which is λ1, by filtering it. The optical signal output from the optical filter 406 is illustrated in FIG. 8 (d).

Specifically, the signal reflected from the optical fiber cable 102 is seen such that optical signals having multiple wavelengths, including a specific wavelength λ2, are alternately exhibited, and the optical filter 406 passes an optical signal of the specific wavelength λ2 but does not pass optical signals of the remaining wavelengths, excluding the specific wavelength λ2.

The optical signal d output from the optical filter 406 is photoelectric-converted by the optical receiver unit 407, is converted into a digital signal by the analog-to-digital conversion unit 409, is processed by the signal processing and control unit 410, and is used to analyze the state of the optical fiber cable. For example, the time period during which an incident optical signal is reflected and returns is measured, whereby whether an optical fiber cable is aberrantly cut and the position at which the optical fiber cable is cut may be determined.

Whether to use the post-optical amplifier 403 and the pre-optical amplifier 405 may be determined according to need. A fiber amplifier, a semiconductor optical amplifier, or the like may be used as the pre-optical amplifier 403 and the post-optical amplifier 405.

Figure 7:
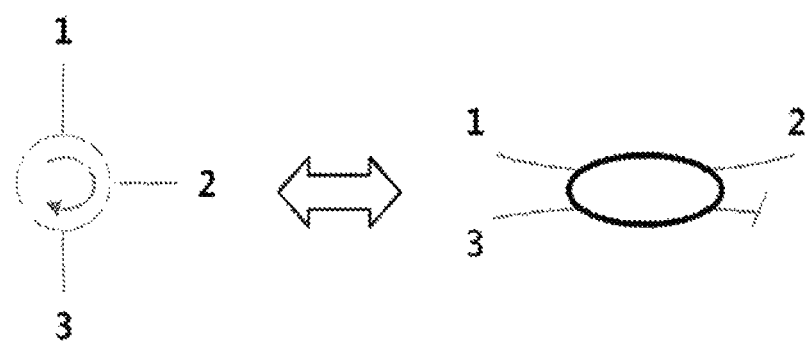
FIG. 7 shows the corresponding relationship between an optical circulator and a directional coupler.

Also, a directional optical coupler may substitute for the optical circulator 404, and FIG. 7 shows the ports of the optical circulator 404 and the counterparts thereof in the directional optical coupler.

While this specification contains many features, the features should not be construed as limitations on the scope of the present invention or the appended claims. Certain features described in the context of separate exemplary embodiments can also be implemented in combination in a single exemplary embodiment. Conversely, various features described in the context of a single exemplary embodiment can also be implemented in multiple exemplary embodiments separately or in any suitable subcombination.

It should be noted that various substitutions, modifications, and changes may be made to the present invention by a person having ordinary skill in the technical field to which the present disclosure belongs without departing from the spirit and scope of the present invention, and the present invention is not limited by the above-described embodiments and the accompanying drawings.

What is claimed is:

1. An optical time domain reflectometer, comprising:
a wavelength-tunable laser configured to output an optical signal having a wavelength that varies with time so that at least two wavelengths are alternately repeated, in response to a control signal received from a controller; and
an optical filter configured to selectively pass a predetermined wavelength portion in a reflected optical signal that is returned from an optical fiber cable.

2. The optical time domain reflectometer of claim 1, wherein
the wavelength of the optical signal varies between a first wavelength and a second wavelength, and
the optical filter configured to pass a wavelength portion corresponding to the second wavelength.

3. The optical time domain reflectometer of claim 1, wherein an intensity of the optical signal is maintained at a constant level.

4. The optical time domain reflectometer of claim 1, wherein
the control signal has at least two levels, and
the wavelength of the optical signal varies corresponding to each level of the control signal.

5. The optical time domain reflectometer of claim 1, wherein the wavelength-tunable laser comprises:
a laser diode for generating the optical signal;
an optical waveguide for changing the wavelength of the optical signal according to a temperature; and
a thermal electrode for adjusting the temperature of the optical waveguide in response to the control signal.

6. The optical time domain reflectometer of claim 1, further comprising:
an optical circulator for transmitting the optical signal to the optical fiber cable and transmitting the reflected optical signal to the optical filter.

7. The optical time domain reflectometer of claim 1, further comprising:
a first optical amplifier for amplifying the optical signal.

8. The optical time domain reflectometer of claim 1, further comprising:
a second optical amplifier for amplifying the reflected optical signal.

9. The optical time domain reflectometer of claim 1, further comprising:
a directional optical coupler for transmitting the optical signal to the optical fiber cable and transmitting the reflected optical signal to the optical filter.

10. An optical time domain reflectometer, comprising:
a wavelength-tunable laser; and
a controller configured to output a control signal for tuning an operating wavelength of the wavelength-tunable laser,
wherein the wavelength-tunable laser outputs an optical signal having a wavelength that varies with time so that at least two wavelengths are alternately repeated, in response to the control signal.

11. The optical time domain reflectometer of claim 10, wherein the wavelength-tunable laser comprises:
a laser diode for generating the optical signal;
an optical waveguide for changing the wavelength of the optical signal according to a temperature; and
a thermal electrode for tuning the operating wavelength of the optical waveguide by adjusting the temperature of the optical waveguide in response to the control signal.

12. The optical time domain reflectometer of claim 10, wherein
the wavelength of the optical signal varies between a first wavelength and a second wavelength, and
an intensity of the optical signal is maintained at a constant level.

13. The optical time domain reflectometer of claim 10, wherein
the control signal has at least two levels, and
the wavelength of the optical signal varies corresponding to each level of the control signal.

* * * * *